US 6,541,917 B1

(12) United States Patent
Rostaing et al.

(10) Patent No.: US 6,541,917 B1
(45) Date of Patent: Apr. 1, 2003

(54) SECTION OF PIPE FOR A GAS TREATMENT DEVICE AND DEVICE INCORPORATING SUCH A SECTION OF PIPE

(75) Inventors: Jean-Christophe Rostaing, Paris Cedex (FR); Michel Moisan, Outremont (CA); Roxane Etemadi, Argenteuil (FR); Daniel Guerin, Paris Cedex (FR)

(73) Assignee: L'Air Liquide Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 09/461,044

(22) Filed: Dec. 15, 1999

(30) Foreign Application Priority Data

Dec. 22, 1998 (FR) .............................. 98 16246

(51) Int. Cl.⁷ ................................................ H01J 7/24
(52) U.S. Cl. .......................... 315/111.21; 118/723 MW
(58) Field of Search ................. 315/111.21, 111.01, 315/112; 250/493.1; 118/723 MW, 722, 723 R (56) References Cited

U.S. PATENT DOCUMENTS 5,965,786 A * 10/1999 Rostaing et al. ......... 204/157.15

FOREIGN PATENT DOCUMENTS

| DE | 3144857 A1 | 5/1983 |
| EP | 0 874 537 A1 | 10/1998 |
| FR | 2 595 876 | 9/1987 |

OTHER PUBLICATIONS

Patent Abstracts of Japan, vol. 96, No. 10, Oct. 31, 1996, JP 08 158073.
Patent Abstracts of Japan, vol. 5, No. 186, Nov. 25, 1981, JP 56 111283.

* cited by examiner

Primary Examiner—Don Wong
Assistant Examiner—Thuy Vinh Tran
(74) Attorney, Agent, or Firm—Burns, Doane, Swecker & Mathis, L.L.P.

(57) ABSTRACT

A section of pipe, for a device for treating a gas by exciting the latter by way of incident microwave radiation suitable for producing a surface-wave plasma in the gas, including a discharge tube made of dielectric material intended to pass through the device in a region for concentrating the incident radiation. The tube comprises, over at least part of its length, a double wall.

24 Claims, 4 Drawing Sheets

SECTION OF PIPE FOR A GAS TREATMENT DEVICE AND DEVICE INCORPORATING SUCH A SECTION OF PIPE

This application claims priority under 35 U.S.C. §§119 and/or 365 to 98 16246 filed in France on Dec. 22, 1998; the entire content of which is hereby incorporated by reference.

BACKGROUND OF THE INVENTION

1. Field of the Invention

The present invention relates to a section of pipe for a gas treatment device in which the gas is excited by a surface-wave plasma, particularly at atmospheric pressure.

2. Description of the Related Art

A known type of exciter device effective for this application is known by the name "surfaguide" or surface waveguide.

This type of device comprises a hollow structure forming a waveguide made of electrically conductive material, intended to be connected to a microwave generator and provided with a passage through which a pipe made of dielectric material passes, in which the gas to be excited flows, and with a region for concentrating the microwave radiation produced by the generator onto the pipe for the purpose of producing, during operation of the device, a surface-wave plasma in the gas.

One particularly advantageous application of this type of device is the plasma treatment of a chemically non-reactive gas containing impurities consisting of perfluorinated greenhouse-effect gaseous compounds.

In particular, it allows the gas to be treated and the impurities that it contains to be placed in an electric field sufficiently intense to produce an electrical discharge by ionization of the gas molecules, this discharge being caused by electrons being stripped off the molecules of the initially neutral gas.

Under the action of the discharge, the molecules of the base gas, that is to say the gas to be purified, are dissociated in order to form radicals smaller in size than the initial molecules and, consequently, where appropriate, individual atoms, these atoms and fragments of molecules thus excited giving rise to substantially no chemical reaction.

After passing through the discharge, the atoms and molecules of the base gas undergo de-excitation and recombination, respectively, in order to re-emerge intact.

On the other hand, the impurities, by being excited, undergo irreversible dissociation and transformation, forming new molecular fragments having chemical properties different from those of the initial molecules, which are then capable of being extracted from the gas by a suitable subsequent treatment.

This type of technique allows large volumes of gas to be effectively treated. However, its reliability is relatively poor because of the fact that the gaseous medium present in the discharge has a relatively high concentration of high-energy fluorinated radical species which make this gaseous medium particularly corrosive with respect to the wall of the pipe in which the plasma is established.

For example, when a pipe made of a silica tube having a thickness of 1 mm is used, this tube can be punctured in less than ten minutes in the region for concentrating the incident microwave radiation, the microwave power density being a maximum in this region.

Furthermore, when nitrogen is used as the plasma gas, a gas which is very difficult to ionize and generates particularly hot plasmas, the heating of the tube in the region for concentrating the radiation generally causes it to melt, even in the absence of a fluorinated compound, and this happens relatively quickly.

Finally, during operation, the silica tube is subjected to very severe thermomechanical stresses liable to result in the appearance of cracks.

SUMMARY OF THE INVENTION

The object of the invention is to overcome the aforementioned drawbacks, on the one hand by reducing the corrosion of the pipe in which the discharge is maintained and on the other hand by allowing normal operation of the device to be maintained even after the appearance of a crack in the wall in contact with the plasma.

The subject of the invention is therefore a section of pipe for a device for treating a gas by exciting the latter by means of incident microwave radiation suitable for producing a surface-wave plasma in the gas, the section of pipe including a discharge tube made of dielectric material intended to pass through the device in a region for concentrating the incident radiation, and through which the gas to be excited is intended to flow, characterized in that the tube comprises, over at least part of its length, a double wall, the walls lying in a heat-exchange relationship.

The discharge resistance of the tube is thus improved, while retaining effective removal of the heat given off by the plasma.

In various embodiments, the section of pipe according to the invention may furthermore comprise one or more of the following characteristics, taken in isolation or in any technically possible combination:

- the space between the inner and outer walls of the tube is filled with a thermally conductive dielectric material which is relatively insensitive to the chemical species coming from the plasma.

Thus, even after the appearance of a crack in the inner wall of the discharge tube, the species capable of migrating through the crack are stopped by the layer of material lying between the walls of the tube.

- the material filling the space between the inner and outer walls comprises boron nitride;
- the inner wall of the discharge tube in a part intended to be placed in the region for concentrating the incident radiation comprises sapphire;
- on either side of the part intended to be placed in the region for concentrating the incident radiation, the inner wall of the discharge tube comprises a ceramic;
- the ceramic is a ceramic based on aluminium nitride or on alumina;
- the inner wall of the discharge tube is made of a ceramic based on aluminium nitride;
- the outer wall of the discharge tube is made of a ceramic based on aluminium nitride;
- the outer wall of the discharge tube comprises silica;
- the inner tube is made by stacking lengths of tube which are provided with ends of complementary shape;
- it furthermore comprises a second tube made of dielectric material for jacketing a cooling fluid, in which the discharge tube is mounted, the second tube together with the outer wall of the latter defining a chamber for cooling the discharge tube, this chamber being intended to be connected to a source of dielectric heat-transfer cooling fluid;

the cooling fluid comprises an isoparaffinic polyalphaolefin;

it comprises means for mounting the cooling-fluid jacketing tube around the discharge tube in a sliding manner so as to allow these tubes to expand;

the means for mounting the tubes comprise at least one support provided with a stepped internal passage into which one of the end regions of each tube passes, the passage comprising a first end bore, in which a member for holding one end of the discharge tube and for holding a fitting which ensures that the discharge tube is supplied with gas to be treated is mounted, a central bore, through which the discharge tube passes, and a second end bore, into which the jacketing tube is fitted with interposition of a O-ring seal;

the fitting constitutes a head capping off the end of the discharge tube and comprises a thread which engages with a complementary thread made in the holding member;

it furthermore comprises a second seal interposed between the holding member and the fitting;

the support is provided with a channel for supplying the jacketing tube with cooling fluid, this channel emerging in the internal bore, and is furthermore provided with an added sealing membrane covering the support and the holding member; and the section of pipe comprises means for stopping the holding member from rotating in the support.

The subject of the invention is also a device for exciting a gas, of the surface-waveguide type, having a hollow structure forming a waveguide made of electrically conductive material, which structure is intended to be connected to a microwave generator and is provided with a passage through which a pipe made of dielectric material passes, in which the gas to be excited flows, and with a region for concentrating the microwave radiation produced by the generator onto the pipe for the purpose of producing, during operation of the device, a surface-wave plasma in the gas, characterized in that the pipe comprises a section of pipe as defined above.

DETAILED DESCRIPTION OF THE PREFERRED EMBODIMENTS

Figure 1:
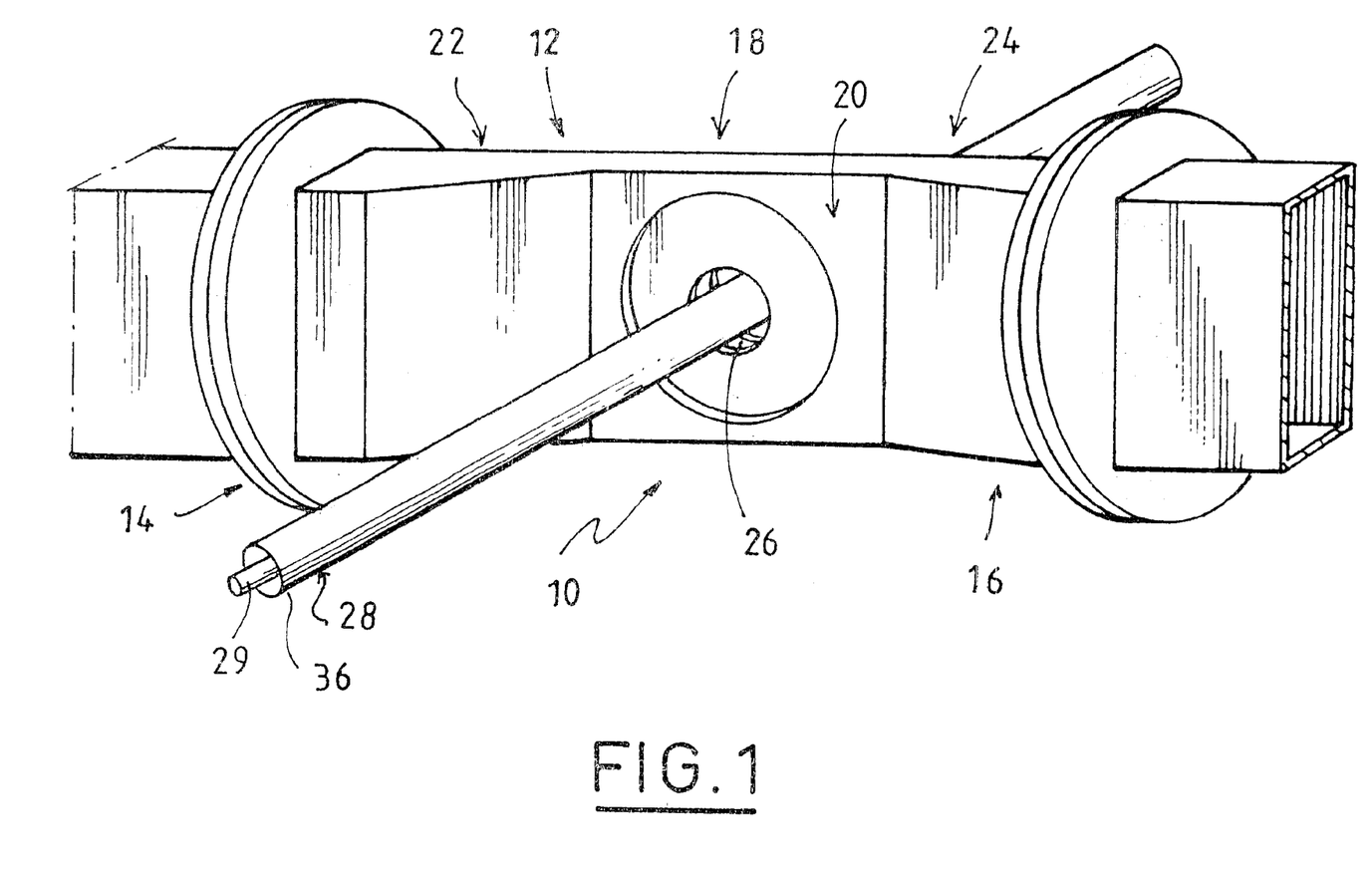
FIG. 1 is a schematic perspective view of a surface waveguide using a section of pipe according to the invention.

FIG. 1 shows a schematic perspective view of a surface waveguide denoted by the general numerical reference 10.

The surface waveguide 10 consists mainly of a hollow structure 12 of longitudinal shape, made of an electrically conductive material suitable for the envisaged use, particularly a metal.

The hollow structure 12 preferably has a parallelepipedal cross section and has two open ends, respectively 14 and 16, one end being intended to be connected to a microwave generator and the other end to means suitable for forming a short-circuit, preferably a conducting plate placed transversely and longitudinally adjustable. (these means note being shown).

Between the two end regions 14 and 16 the structure 12 has a region 18 of narrower cross section, comprising a central part 20 of constant cross section extending between two parts 22 and 24 of cross section which increases linearly towards the end regions 14 and 16.

The walls making up the central part 20, which constitutes a region for concentrating the incident microwave radiation, are each provided with a hole 26, these holes forming a passage for a section of pipe 28 made, as will be described in detail below, from suitable dielectric materials.

The section of pipe 28, imaginarily truncated in this FIG. 1 and illustrated schematically, comprises a discharge tube 29 in which a column of gas to be excited flows and in which the plasma is created under the action of the microwave radiation produced by the generator.

One application of the surface waveguide illustrated in FIG. 1 is the purification of krypton and xenon by the destruction of molecules of impurities, such as $CF_4$ or $CH_4$, by converting these impurities into reactive gaseous compounds capable of being treated by the action of corresponding reactive compounds after passing through the discharge.

Figure 2:
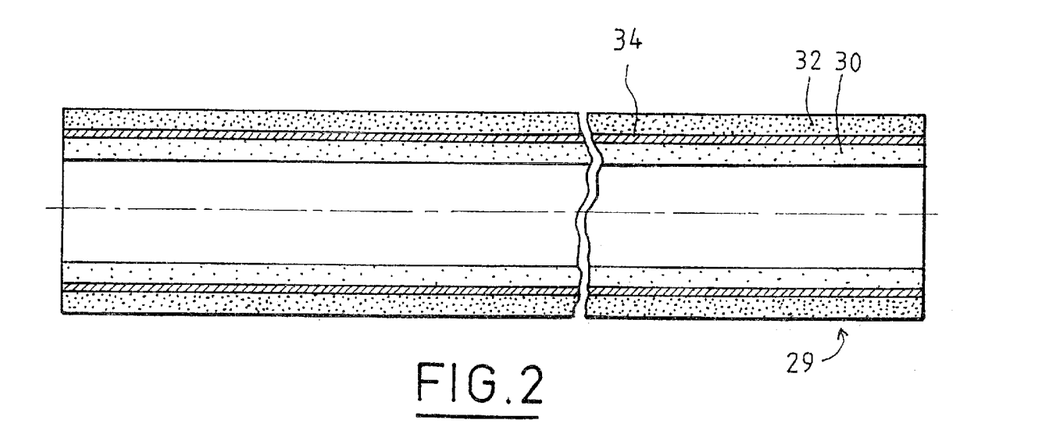
FIG. 2 is a longitudinal sectional view on a larger scale of a first exemplary embodiment of a section of pipe according to the invention.

As may be seen in FIG. 2, and in accordance with the invention, the discharge tube 29 comprises a double wall, namely an inner wall 30 and an outer wall 32, extending over at least part of its length and intended to be placed in the region for concentrating the incident radiation in which the discharge is maintained.

In the embodiment illustrated, the discharge tube 29 comprises a double wall extending over its entire length.

To do this, the discharge tube 29 is formed by the combination of two tubes, an inner tube 30 making up the inner wall and the outer tube 32 making up the outer wall, these tubes being placed coaxially and having diameters suitable for defining between them a relatively narrow and generally cylindrical space 34, nominally less that 1 mm.

In order for the tube 29 to be able to be used in the context of the envisaged application, that is to say to be able to withstand the chemical species generated in the discharge and the thermal stresses to which the tube 29 is subjected, the latter must especially have the following properties:

Firstly, it must not become corroded to an appreciable extent in a high-density fluorinated plasma medium, particularly when the base gas is hydrogen or nitrogen.

Secondly, it must have excellent thermo-mechanical properties so as to prevent any cracking across the thickness of its wall, something which would provide a passage for the species in the gas, although, as will be mentioned below, its internal surface may be raised to a temperature of the order of 800° C. while its outer surface is cooled to a temperature of less than 100° C.

It must have a very high thermal conductivity so as to allow rapid removal of heat produced by the plasma.

Finally, the dielectric losses at the frequency of the incident microwave radiation must be very low, this being so over a temperature range going from room temperature to several hundreds of degrees Celsius. More specifically, the dielectric loss tangent must typically be less than $10^{-3}$ over the entire range of temperatures envisaged.

To achieve these objectives, according to a first exemplary embodiment, illustrated in FIG. 2, the inner wall 30 of the discharge tube 29 is made from a material which is relatively inert with respect to the fluorinated chemical species in the plasma, which has a high thermal conductivity and has very low dielectric losses up to very high temperatures, namely sapphire. However, this material has relatively poor thermomechanical properties and tends to crack.

To overcome this drawback, the outer wall 32 of the discharge tube is made of a material having excellent mechanical properties, that is to say having virtually no risk of cracking or of fracturing, preferably silica. However, should the inner wall 30 crack, gaseous species coming from the plasma could migrate through the crack and come into contact with the outer wall 32. The etching of the latter which would result from this would be less rapid that for a silica wall in direct contact with the plasma, but it would nevertheless be unacceptable for very long-term use without repair or replacement.

In order to ensure the thermomechanical integrity of the tube 29, the interstitial space between the inner 30 and outer 32 walls is filled with a dielectric material which is a good thermal conductor having very good thermomechanical properties and being resistant in an oxidizing and/or fluorinated medium when the energy of the chemical species is not too high, in this case boron nitride.

Preferably, in order for the space 34 to be easily filled, the boron nitride is used in liquid form and formed by thermal curing, such as the type A COMBAT™ Boron Nitride Coating from Carborundum.

As a variant, it is possible to make the inner wall 30 of the discharge tube 29 from a machineable ceramic based on aluminium nitride, a material very resistant to fluorinated nitrogen plasmas, having excellent thermomechanical properties and being substantially non-absorbent at a frequency of 2.45 GHz, that is to say absorbing sufficiently little not to be degraded.

For example, this ceramic material consists of SHAPAL™-M SOFT from Tokuyama Corporation, Tokyo. This material also has the advantage of being machined easily and at an acceptable cost, and therefore allows tubular components to be produced to very precise dimensions.

It is thus possible with such a material to obtain a relatively tight fit between the inner and outer tubes. If the thickness of the residual air film between the two tubes does not exceed a few hundredths of a millimeter, the thermal conductivity, although not necessarily very uniform, is sufficient to allow the heat to be removed efficiently. In this case, the layer of dielectric materials filling the interstitial space between the inner 30 and outer 32 walls may be omitted.

Various embodiments of the section of pipe according to the invention will now be described with reference to FIGS. 3 to 6.

Figure 3:
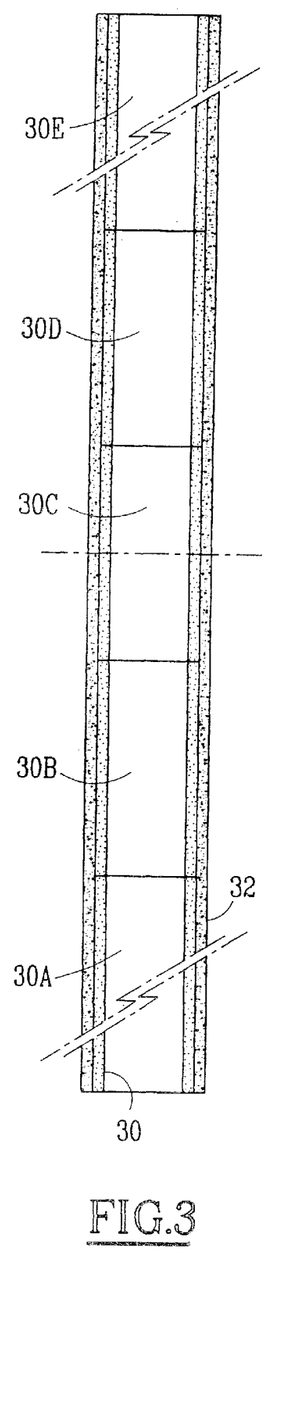
FIGS. 3 to 5 respectively illustrate, schematically, further embodiments of the section of pipe according to the invention.

The embodiment illustrated in FIG. 3 corresponds to the exemplary embodiment of FIG. 2 in which the inner tube 30 is made of sapphire or of SHAPAL™-M and the outer tube 32 is made of silica. The interstitial space between the inner and outer tubes (which is not shown) may be filled with boron nitride, without this being necessary.

This FIG. 3 shows that the inner tube 30 is made by assembling cylindrical lengths 30-A, 30-B, 30-C, 30-D and 30-E stacked together, boron nitride being applied between the joints so as to seal them off and form a barrier to the migration of the fluorinated species into the silica. This application may be carried out, for example, on the lower end of each length before it is introduced into the silica tube in order to include it in the stack.

As mentioned previously, in order to reduce the manufacturing costs, it is possible to provide the discharge tube 29 with an inner tube 30 over a limited length corresponding approximately to the region in which the plasma is created.

Figure 4:
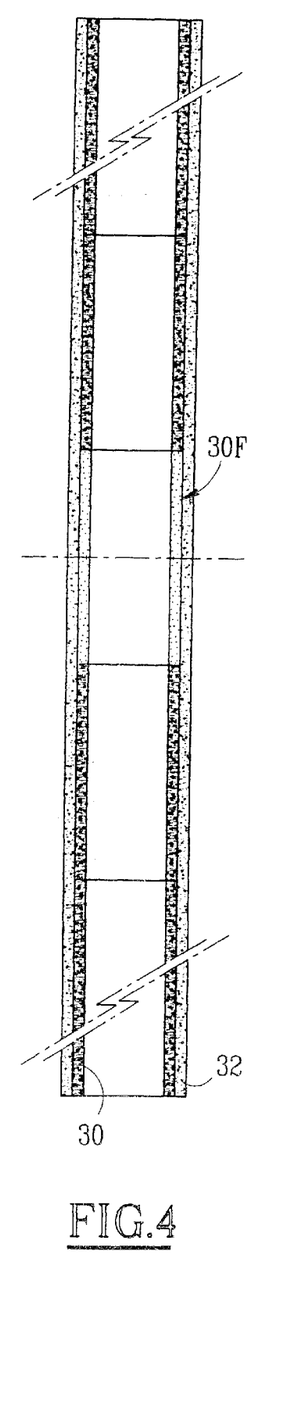

It is also possible, according to one particular embodiment, illustrated in FIG. 4, to provide the discharge tube 29 with an inner wall 30 having a central length 30-F made of sapphire and intended to be placed in the region for concentrating the incident radiation, that is to say in the region in which the plasma has a maximum density, this length 30-F being extended, on either side of this region, by a portion of tube made of ceramic, for example sintered alumina, or preferably made of SHAPAL™.

Of course, as mentioned previously, it is necessary to provide a relatively close contact between each junction region so as to prevent high-energy fluorinated species being able to migrate into the space 34 and towards the outer tube 32.

Figure 5:
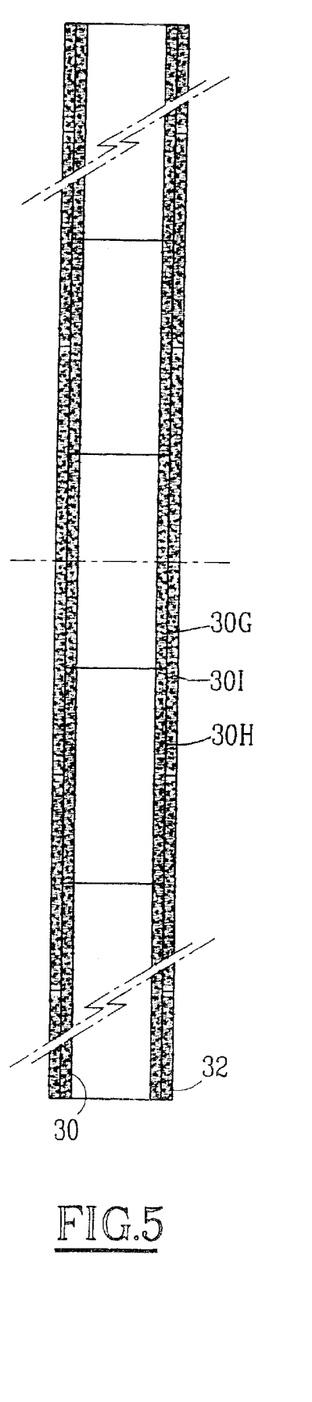

FIG. 5 illustrates another exemplary embodiment of the section of pipe according to the invention, in which the inner tube 30 and the outer tube 32 are both made by assembling tubular lengths made of SHAPAL™ which are stacked one on top of the other and bonded together with boron nitride in such a way that each junction region between two lengths 30-G and 30-H of the inner tube 30 is covered by a length 30-I of the outer tube 32. An outer tube for holding the assembly together, made of silica, may be provided.

It will be noted that the embodiment illustrated in FIG. 4, in which a central length 30-F made of sapphire is located in the launching gap, has the maximum reliability in so far as the absorption of the microwave power by the tube remains negligible in this region of the tube and, in this region, the plasma remains relatively centred with respect to the axis of the tube, whatever the operating conditions, and therefore does not cling to the inner wall of the tube.

The exemplary embodiments using SHAPAL™ are advantageous in so far as this material is one of the most resistant to fluorinated nitrogen plasmas. This material is therefore particularly advantageous for internally lining the silica outer tube in a region in which the plasma is liable to become off-centred and come into contact with the wall, that is to say on either side of the region corresponding to the launching gap.

Various methods of assembling the section of pipe described previously will now be explained with reference to FIGS. 6 to 9.

Figure 6:
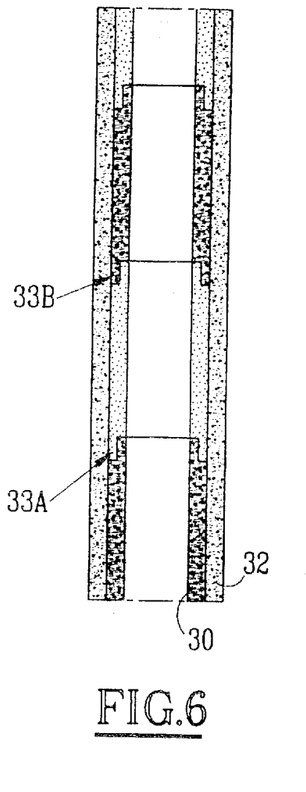
FIGS. 6 to 8 illustrate, schematically, various ways of assembling the section of pipe according to the invention.

Referring firstly to FIG. 6, a first method of assembling the lengths consists in configuring each length making up the inner tube 30 in the form of tubular lengths provided with ends 33-A and 33-B, one end, 33-A, defining a cylindrical bore and the other end, 33-B, defining a cylindrical skirt, the other lengths being provided with complementary ends shaped so as to fit together by shape complementarity.

It will be noted that this method of assembly is suitable for assembling the lengths made of SHAPAL™ or, to a lesser extent, made of sapphire, the machining being more difficult to carry out in this case.

It will also be noted that, as mentioned previously, boron nitride is applied in the joints in order to form a barrier preventing the fluorinated species from migrating into the outer silica.

Figure 7:
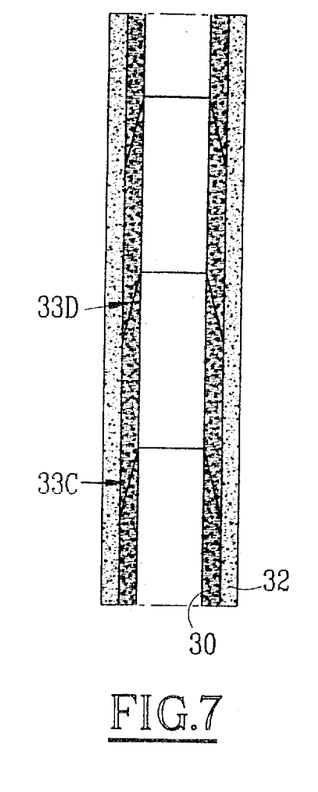
Figure 8:
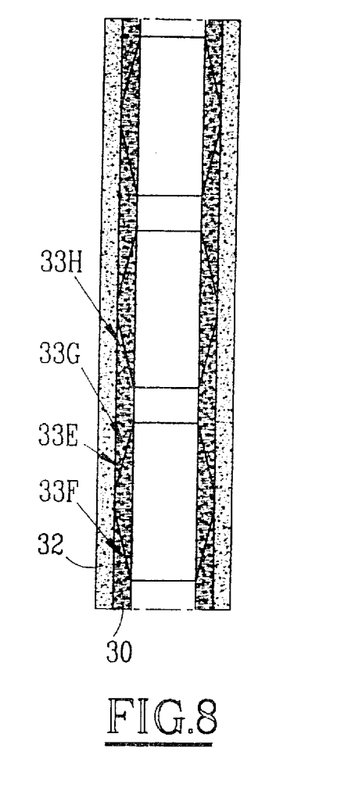

Other methods of assembly, illustrated in FIGS. 7 and 8, are conceivable for assembling the lengths made of SHAPAL™.

These figures show in fact that the lengths making up the inner tube 30 may be configured in the form of tubular lengths provided with frustoconical ends 33-C and 33-D.

For example, one of the ends, 33-C is a female frustoconical end, the other end, 33-D, being a male frustoconical end (FIG. 7).

As a variant, both ends 33-E and 33-F of one of the lengths are male frustoconical ends, both ends 33-G and 33-H of the adjacent length being female frustoconical ends (FIG. 8).

As mentioned previously, the discharge tube 29 is also cooled so as to lower the temperature of its outer surface down to a temperature close to 100° C.

Figure 9:
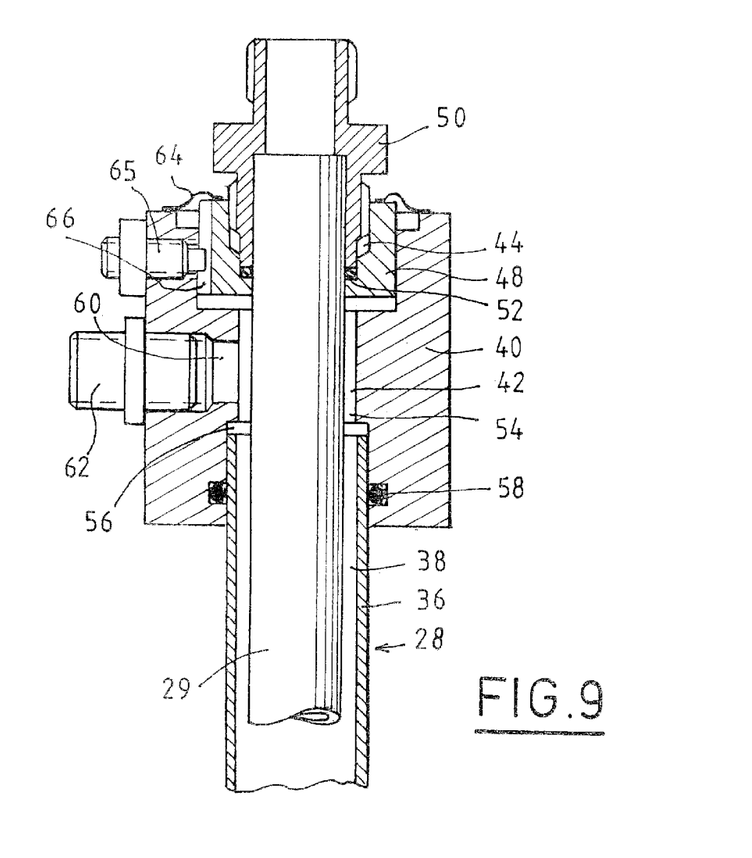
FIG. 9 is a longitudinal sectional view of an end region of the section of pipe according to the invention.

To do this, and as shown in FIGS. 1 and 9, the section of pipe 28 furthermore comprises a second tube 36 made of dielectric material, for example silica, which is used for jacketing a cooling fluid and in which the discharge tube 29 is mounted.

As may be seen in FIG. 9, the jacketing tube 36 and the discharge tube 29 between them define a chamber 38 for cooling the discharge tube 29, the chamber 38 being of substantially cylindrical shape and intended to be connected to a source (not illustrated) of heat-transfer cooling fluid consisting, for example, of an isoparaffinic polyalphaolefin (PAO), like that sold by Lubri Delta Inc, Laval, Quebec, materials conventionally used as fluid in hydraulic circuits and having good heat-transfer properties while still being a very good dielectric.

Finally, and as may be seen in FIG. 9, the section of pipe is provided with means for mounting the discharge tube 29 inside the jacketing tube 36 in a sliding manner so as to allow these tubes to expand, one with respect to the other, during operation of the device 10.

As may be seen in this figure, the means for mounting the tubes comprise a support 40, made of a suitable block of metal or of polymer, provided with a stepped internal passage 42 into which a corresponding end region of each tube 29 and 36 pass.

The passage 42 has a first end bore 44 in which a member 48 used for holding one end of the discharge tube 29 and for holding an end fitting 50 used for supplying the discharge tube 29 with gas to be treated is mounted in a sliding manner.

More particularly, the fitting 50 constitutes a head capping off the free end of the discharge tube 29 and being provided with an external thread which interacts with a complementary internal thread made in the holding member 48, an O-ring seal 52 being provided in the bottom of the holding member 48 on which the fitting 50 rests.

Moreover, the support 40 has a central bore 54 through which the discharge tube 29 passes and a second end bore 56, opposite the first bore 44, into which the jacketing tube 36 is fitted, with interposition of an O-ring 58 for sealing and retaining, by friction, the tube 36.

Finally, FIG. 9 shows that the support 40 is furthermore provided with a supply channel 60 having a fitting 62 which communicates with a source for supplying the cooling fluid, this channel 60 emerging in the internal bore so as to supply the chamber 38 with the cooling fluid.

An added, preferably adhesively bonded, sealing membrane 64 covers the support 40 and the holding member 48 so as to avoid any leak of the cooling fluid.

A key 65, carried by the support 40, engages in a groove 66 made in the holding member 48 so as to stop the member 48 from rotating in the support 40 so as to prevent, during mounting, the membrane from being damaged due to the effect of the tightening torque applied to the fitting 50.

It should be noted that a substantially identical assembly is provided at the other end of the discharge tube in order to extract the heat-transfer fluid and collect the gases after treatment by the plasma.

This assembly, which allows the discharge tube 29 and the jacketing tube 36 to expand freely, prevents the appearance of excessively high thermomechanical stresses when the plasma is excited, while allowing effective flow of the cooling fluid in the chamber 38.

It should be understood that the invention that has just been described, using a composite discharge tube provided with an inner wall relatively insensitive to the fluorinated species present in the discharge, having, on the one hand, a thermal conductivity allowing the heat produced by the plasma to be rapidly removed and relatively low dielectric losses because of the presence of an inner tube comprising sapphire and, on the other hand, thermomechanical properties at a high level because of the relationship allowing heat exchange between the outer tube and the inner tube, allows considerable reduction in the corrosion of the discharge tube and prevents or limits the thermomechanical failure of these materials.

Furthermore, in the case of the use of a sapphire inner tube, even after the appearance of a crack in the inner tube, the presence of boron nitride filling the interstitial space between the inner and outer walls prevents any migration of corrosive species towards the outer wall of the tube, in so far as it constitutes a passivation layer for the outer wall of the discharge tube against these species.

As mentioned previously, one application of the surface-waveguide device described with reference to FIG. 1 is the purification of krypton and xenon, by the destruction of impurities such as $CF_4$ and $CH_4$.

The device can be mounted on the output of a distillation plant for extracting these compounds or it can be supplied from bottles in which krypton, xenon or a mixture of these gases are stored under pressure.

In order to carry out this purification, the surface waveguide supplied with microwaves is used to create, at atmospheric pressure, a plasma within which very high-energy electron excitations occur, corresponding to temperatures of several tens of thousands of Kelvin, thus making it possible, by electron collision, to excite the atoms and molecules making up the gas, and in particular to transform the molecules of impurities, such as $CF_4$ and $CH_4$, from a chemically relatively stable state to a reactive state, which allows them subsequently to be removed either following their immediate and spontaneous condensation in the form of coatings or solid particles (fluorocarbon polymers, carbon black, etc.) or by making them react with a corresponding solid or liquid reactive compound. It should be understood that the atoms and molecules of the gas to be purified are also excited in the discharge, but they undergo de-excitation and/or recombination immediately on leaving the latter and, moreover, they do not react with the solid or liquid reactive compounds over which the gas to be purified then flows.

Thus, for example, an incident microwave power of 1500 W makes it possible to treat 1.2 $m^3$/h of krypton optionally mixed with oxygen in order to improve the execution of the process of transforming the $CF_4$ into reactive species.

The incident mixture thus excited, after passing over an alkaline medium, such as soda lime, substantially no longer contains any impurities.

It should be understood that the invention described above also allows other types of impurities, and more generally perfluoronated or hydrofluorocarbon gases, to be destroyed just as effectively.

Thus, it is possible, using such a surface waveguide, to destroy, for example, approximately 97% of the $C_2F_6$ in an incoming gas mixture containing 4.5% $C_2F_6$ mixed with $O_2$ and $N_2$, for an incident microwave power of 790 W.

The invention is therefore applicable, in general, to the purification of any gas and, in particular, to the destruction of PFC-type compounds (fluorocompounds) and/or CFC compounds (compounds of the chlorofluorocarbon type), especially when the latter are present in gaseous effluents, especially those emanating from reactors for fabricating semiconductors or from other chemical reactors, producing such products in the pure state or preferably diluted in other gases, especially nitrogen, argon, helium, inert gases, oxygen, hydrogen and/or carbon dioxide, by themselves or as mixtures in any proportions.

What is claimed is:

1. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and with a space between the inner and outer walls of the tube being filled with a thermally conductive dielectric material which is relatively insensitive to the chemical species coming from the plasma.

2. The section of pipe according to claim 1, characterized in that the inner wall of the discharge tube is made of ceramic based on aluminum nitride.

3. The section of pipe according to claim 1, characterized in that the outer wall of the discharge tube comprises silica.

4. The section of pipe according to claim 1, characterized in that the inner tube is made by stacking lengths of tube which are provided with ends of complementary shape.

5. The section of pipe according to claim 1, characterized in that it furthermore comprises a second tube made of dielectric material for jacketing a cooling fluid, in which the discharge tube is mounted, the second tube together with the outer wall of the latter defining a chamber for cooling the discharge tube, this chamber being connected to a source of dielectric heat-transfer cooling fluid.

6. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and that a material fills the space between the inner and outer walls which comprises boron nitride.

7. The section of pipe according to claim 6, characterized in that the inner wall of the discharge tube, in a part placed in the region for concentrating the incident radiation, comprises sapphire.

8. The section of pipe according to claim 6, characterized in that the inner wall of the discharge tube is made of ceramic based on aluminum nitride.

9. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and that an inner wall of the discharge tube, in a part to be placed in the region for concentrating the incident radiation, comprises sapphire.

10. The section of pipe according to claim 9, characterized in that, on either side of the part that is placed in the region for concentrating the incident radiation, the inner wall of the discharge tube comprises a ceramic.

11. The section of pipe according to claim 10, characterized in that the ceramic is a ceramic based on aluminium nitride or on sintered alumina.

12. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and that the inner wall of the discharge tube is made of a ceramic based on aluminium nitride.

13. The section of pipe according to claim 12, characterized in that the outer wall of the discharge tube is made of a ceramic based on aluminium nitride.

14. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and that the outer wall of the discharge tube comprises silica.

15. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and with the inner wall being made by stacking lengths of tube which are provided with ends of complementary shape.

16. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that the tube comprises, over at least part of its length, a double wall, the walls lying in a heat-exchange relationship, and with the section of pipe further comprising a second tube made of dielectric material for jacketing a cooling fluid, in which the discharge tube is mounted, the second tube together with the outer wall of the latter defining a chamber for cooling the discharge tube, this chamber being connected to a source of dielectric heat-transfer cooling fluid comprising an isoparaffinic polyalphaolefin.

17. The section of pipe according to claim 16, characterized in that it comprises means for mounting the cooling-fluid jacketing tube around the discharge tube in a sliding manner so as to allow these tubes to expand.

18. A section of pipe for a device for treating a gas by exciting the latter by means of incident microwave radiation suitable for producing a surface-wave plasma in the gas, the section of pipe including a discharge tube made of dielectric material passing through the device in a region for concentrating the incident radiation, and through which the gas to be excited flows, characterized in that:

- the tube comprises, over at least part of its length, a double wall, the walls lying in a heat-exchange relationship;
- a second tube made of dielectric material for jacketing a cooling fluid, in which the discharge tube is mounted, the second tube together with the outer wall of the latter defining a chamber for cooling the discharge tube, this chamber being connected to a source of dielectric heat-transfer cooling fluid;
- means for mounting the cooling-fluid jacketing tube around the discharge tube in a sliding manner so as to allow these tubes to expand;
- with the means for mounting the tubes comprising at least one support provided with a stepped internal passage into which one of the end regions of each tube passes, the passage comprising a first end bore, in which a member for holding one end of the discharge tube and for holding a fitting which ensures that the discharge tube is supplied with gas to be treated is mounted, a central bore, through which the discharge tube passes, and a second end bore, into which the jacketing tube is fitted with interposition of a O-ring seal.

19. The section of pipe according to claim 18, characterized in that the fitting constitutes a head capping off the end of the discharge tube and comprises a thread which engages with a complementary thread made in the holding member.

20. The section of pipe according to claim 19, characterized in that it furthermore comprises a second seal interposed between the holding member and the fitting.

21. The section of pipe according to claim 20, characterized in that the support is furthermore provided with a channel for supplying the jacketing tube with cooling fluid, this channel emerging in the internal bore, and in that it is furthermore provided with an added sealing membrane covering the support and the holding member.

22. The section of pipe according to claim 19, characterized in that the support is furthermore provided with a channel for supplying the jacketing tube with cooling fluid, this channel emerging in the internal bore, and in that it is furthermore provided with an added sealing membrane covering the support and the holding member.

23. The section of pipe according to claim 18, characterized in that the support is furthermore provided with a channel for supplying the jacketing tube with cooling fluid, this channel emerging in the internal bore, and in that it is furthermore provided with an added sealing membrane covering the support and the holding member.

24. The section of pipe according to claim 23, characterized in that it comprises means for stopping the holding member from rotating in the support.

* * * * *